(12) United States Patent
Souma (10) Patent No.: US 7,265,958 B2
(45) Date of Patent: Sep. 4, 2007

(54) OVERCURRENT PROTECTION CIRCUIT AND SEMICONDUCTOR APPARATUS

(75) Inventor: Osamu Souma, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 150 days.

(21) Appl. No.: 11/060,312

(22) Filed: Feb. 18, 2005

(65) Prior Publication Data

US 2005/0184710 A1    Aug. 25, 2005

(30) Foreign Application Priority Data

Feb. 20, 2004    (JP)    ............... 2004-044153

(51) Int. Cl.
*H02H 3/08* (2006.01)
(52) U.S. Cl. ....................................... 361/86
(58) Field of Classification Search ............ 361/86
See application file for complete search history.

(56) References Cited

U.S. PATENT DOCUMENTS 6,057,728 A * 5/2000 Igarashi ................ 327/546

7,079,368 B2 * 7/2006 Ishikawa et al. .......... 361/93.1

FOREIGN PATENT DOCUMENTS

| DE | 100 40 477 A1 | 3/2002 |
| JP | 2882597 | 2/1999 |
| JP | 2002-33647 | 1/2002 |

* cited by examiner

Primary Examiner—Michael Sherry
Assistant Examiner—Lucy Thomas
(74) Attorney, Agent, or Firm—Young & Thompson (57) ABSTRACT

The overcurrent protection circuit has a first output voltage detection circuit which compares an output voltage with a first reference value in a first timing after the output circuit starts outputting the output voltage, a second output voltage detection circuit which compares the output voltage with a second reference value in a second timing, and an output control circuit which stops the output from the output circuit according to the output from the first or second output voltage detection circuit.

20 Claims, 8 Drawing Sheets

OVERCURRENT PROTECTION CIRCUIT AND SEMICONDUCTOR APPARATUS

BACKGROUND OF THE INVENTION

1. Field of the Invention

The present invention relates to overcurrent protection circuits and semiconductor apparatus and, particularly, to an overcurrent protection circuit and a semiconductor apparatus which protect an output device from an overcurrent.

2. Description of Related Art

Automobiles, home electric appliances and so on use a semiconductor apparatus called a power switch to control voltages and currents.

An automobile has an actuator which converts an electric signal into a mechanical motion for fuel control or transmission control. An output transistor of the power switch controls the on/off of the current flowing into the actuator. Switching the output transistor from the "off" state to the "on" state is called "turn-on", and switching it from the "on" state or "turn-on" state to the "off" state is called "shutdown". A metal oxide semiconductor field effect transistor, hereinafter as MOS, is used for the output transistor, for example.

In an automobile, a wire harness leading from an output terminal to a load such as an actuator can come off to touch a chassis or the like, which is called a load short-circuit. If the power switch mounted in an automobile starts the turn-on operation under the load short-circuit state, a large current flows into the output transistor while a battery voltage is applied between the transistor's drain and source, which results in breakdown of the output transistor due to heat. Further, if it is in an overcurrent state due to an abnormal load, a large current flows into the output transistor while a certain voltage is applied between its drain and source, which also results in breakdown of the output transistor due to heat. To prevent the breakdown of the output transistor due to the overcurrent, it is required to shut down the circuit or the output transistor instantaneously in the above cases. An overcurrent protection circuit is used for this purpose.

One example of the overcurrent protection circuit combines a timer circuit and a monitor circuit which monitors a voltage between the drain and source of an output transistor, which is disclosed in Japanese Patent No. 2882597 and illustrated in FIGS. 3 and 4. This overcurrent protection circuit shuts down the circuit if the drain-source voltage of the output transistor does not become lower after a given period of time.

Particularly, in the load short-circuit state which gives a stress (load) to the output transistor, it is necessary to shut down the circuit as soon as possible to reduce the stress on the output transistor. However, if the timer is set too short, it causes false anomaly detection to wrongly shut down the circuit in the normal load state. In order to protect the output transistor more safely, a timer circuit which can shut down the circuit immediately in the event of a short circuit in a load without false detection is required.

Figure 7:
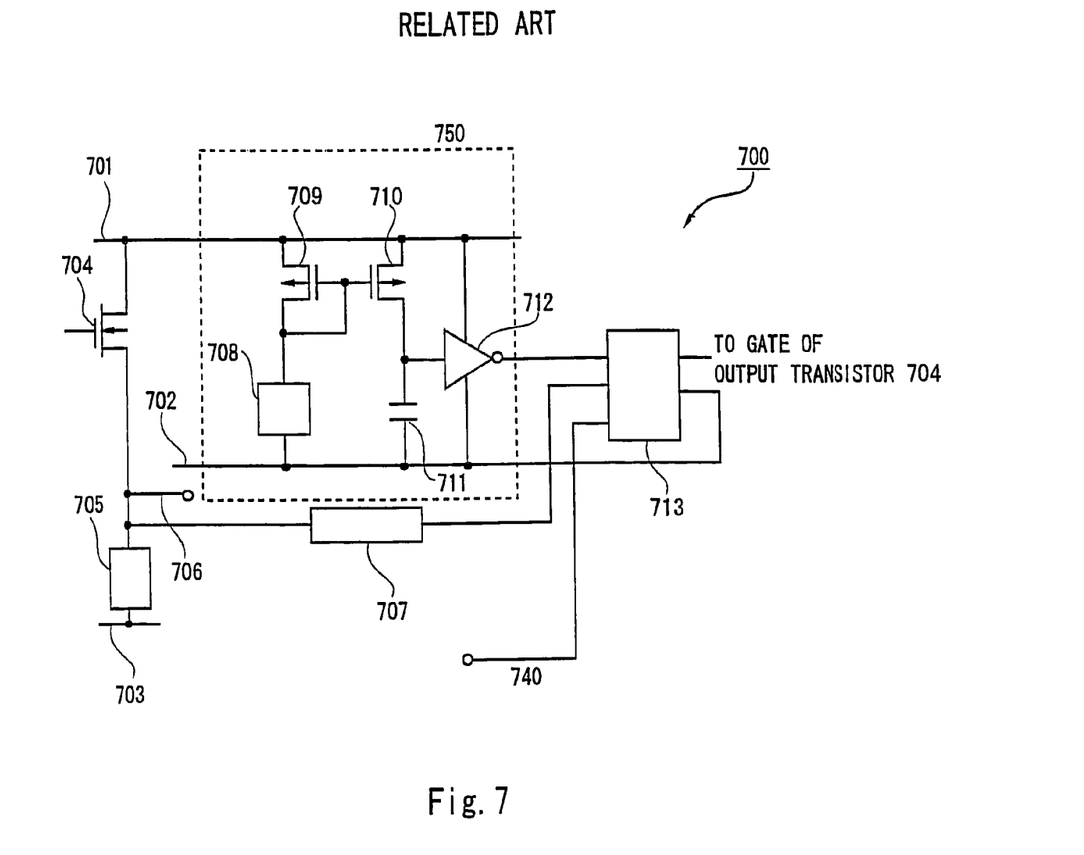
FIG. 7 is a circuit diagram of a conventional power switch.

FIG. 7 is a circuit diagram of a conventional power switch. The power switch 700 includes an output transistor 704, an output voltage detection circuit 707, a timer circuit 750, and a control circuit 713. The timer circuit 750 has a constant current device 708, a Pch enhancement MOS (hereinafter as Pch MOS) 709, a Pch MOS 710, a capacitor 711, and an inverter 712.

The output transistor 704 is a switch for controlling the current and voltage output to a load 705, and it is, for example, an Nch MOS. The output transistor 704 has a drain connected to a first power supply 701, a gate connected to the output side of the control circuit 713, and a source connected to one side of the load 705 through an output terminal 706. The other side of the load 705 is connected to a third power supply 703.

The Pch MOS 709 and the Pch MOS 710 form a current mirror. The sources of the Pch MOS 709 and 710 are connected to the first power supply 701, and the gates are connected to each other and further connected to the drain of the Pch MOS 709. The drain of the Pch MOS 709 is connected to a second power supply 702 through the constant current device 708. The drain of the Pch MOS 710 is connected to the second power supply 702 through the capacitor 711 and also to the control circuit 713 through the inverter 712.

The inverter 712 receives voltages from the first power supply 701 and the second power supply 702. The inverter 712 has the input side connected to the drain of the Pch MOS 710, and the output side connected to the input side of the control circuit 713. The output voltage detection circuit 707 has the input side connected to the output terminal 706, and the output side connected to the input side of the control circuit 713.

The control circuit 713 receives in the input side the output signals from the inverter 712 and the output voltage detection circuit 707, and an input signal 740 from a microcomputer or the like. In accordance with these signals, the control circuit 713 outputs from the output side a gate signal of the output transistor 704 and a voltage of the second power supply 702.

In the power switch 700, the voltage of the second power supply 702 is the same as the voltage of the first power supply 701 before input of the input signal 740 from the microcomputer or the like. Upon input of the input signal 740, a voltage difference is created between the second power supply 702 and the first power supply 701 to activate the timer circuit 750. At the same time, the control circuit 713 outputs a gate signal to turn on the output transistor 704, thereby starting the turn-on of the output transistor 704.

When the timer circuit 750 operates, the current from the constant current device 708 which is reduced in the current mirror composed of the Pch MOS 709 and 710 is charged into the capacitor 711. If the capacitor 711 is charged to a certain voltage to reach the threshold of the inverter 712, the output of the inverter 712 is inverted. This time is a timer time t1.

The output voltage detection circuit 707 monitors the drain-source voltage of the output transistor 704. For example, if the output voltage detection circuit 707 is an inverter, the output of the output voltage detection circuit 707 is inverted when the voltage of the output terminal 706, hereinafter as an output voltage, reaches the threshold V1 of the inverter. The control circuit 713 receives the outputs from the inverter 712 and the output voltage detection circuit 707. If the output voltage does not reach V1 by the timer time t1, an anomaly is detected and the circuit is shut down.

Figure 8A:
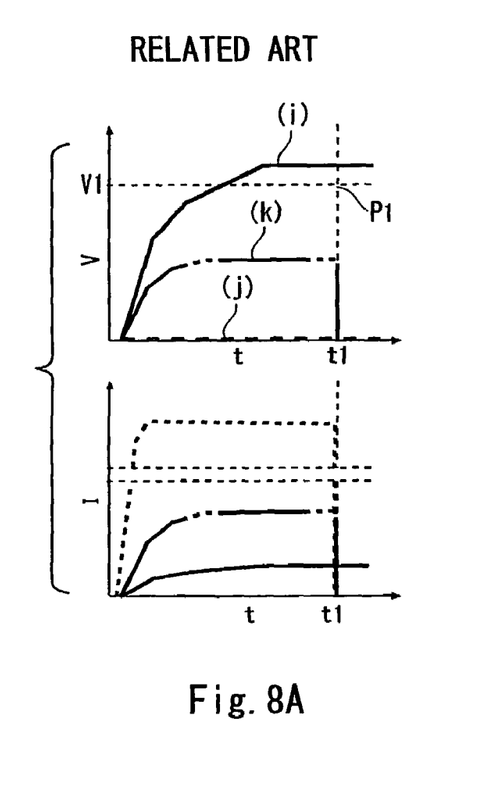
FIGS. 8A, 8B, and 8C are output waveforms of a conventional power switch.
Figure 8B:
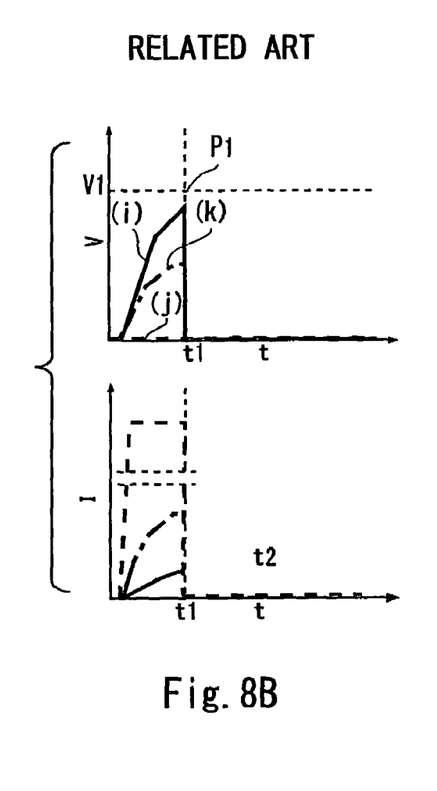
Figure 8C:
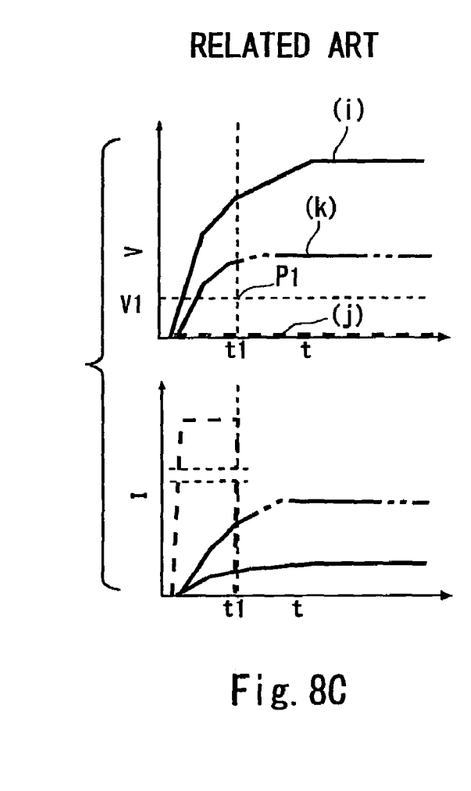

FIGS. 8A, 8B, and 8C show examples of the output waveforms of the power switch 700. In the graphs of FIGS. 8A to 8C, a solid line (i) shows the turn-on of the output transistor when the load 705 is the normal state, a dashed line (j) shows the turn-on when the output terminal 706 is short-circuited to the third power supply 703, called the load short-circuit state. A double dashed line (k) shows the turn-on when an overcurrent occurs. The voltage detected by the output voltage detection circuit 707 is V1, and the timer value of the timer circuit 750 is t1. The crossing point of t1 and V1, which is P1(t1, V1), is an overcurrent detection reference, called a detection reference point.

FIG. 8A shows the output waveforms in the case where V1 is set high and t1 is set long. In the normal state shown in the line (i), the output voltage V reaches V1 at t1. Thus, the circuit is determined as normal and not shut down. In the overcurrent state shown in the line (k), the output voltage V does not reach V1 at t1. Thus, anomaly is correctly detected and the circuit is shut down for safe. However, in the load short-circuit state shown in the line (j), a large current flows immediately after the turn-on, and the large current cannot be detected until t1. Thus, excessive heat can break down the output transistor 704.

If, in the normal state shown in the line (i), the output voltage V falls below V1 after t1, the circuit is immediately shut down.

FIG. 8B shows the output waveforms in the case where t1 is set shorter than in FIG. 8A. In the load short-circuit state and the overcurrent state shown in the lines (j) and (k), the output voltage V does not reach V1 at t1; thus, anomaly is correctly detected to shut down the circuit. However, in this case, the output voltage V does not reach V1 at t1 in the normal state shown in the line (i) as well; thus, anomaly is wrongly detected to shut down the circuit.

FIG. 8C shows the output waveforms in the case where V1 is set smaller and t1 is set shorter than in FIG. 8A. In the normal state shown in the line (i), the output voltage V reaches V1 at t1; thus, the circuit is determined as normal and not shut down. In the load short-circuit state shown in the line (j), the output voltage V does not reach V1 at t1; thus, anomaly is correctly detected and the circuit is shut down. However, in the overcurrent state shown in the line (k), the output voltage V reaches V1 at t1; thus, anomaly cannot be detected and the circuit is not shut down. Excessive heat can thereby break down the output transistor 704.

As described above, use of a single detected output voltage and a single timer value causes false detection and incomplete detection, resulting in a low detection accuracy.

A protection circuit including two timers is disclosed in Japanese Unexamined Patent Application Publication No. 2002-33647 and illustrated in FIG. 3. This circuit detects overcurrent by monitoring a current with a sense MOS. The circuit has problems that it is necessary to place a sense MOS and it is difficult to change a detection threshold and a timer value.

The present invention has recognized that overcurrent protection circuits which set a single detection output voltage and a single timer value are subject to false detection and incomplete detection, having low detection accuracy. For example, as described above, the circuit cannot detect the load short-circuit state if a timer value is long. The circuit wrongly determines the normal state as an abnormal state if a timer value is short. Further, the circuit cannot detect the overcurrent state if a timer value is short and a detection voltage is low.

SUMMARY OF THE INVENTION

According to one aspect of the present invention, there is provided an overcurrent protection circuit for protecting an output circuit outputting an output voltage to a load from an overcurrent which includes a first determination circuit comparing the output voltage with a first reference value in a first timing after the output circuit starts outputting the output voltage and determining a comparison result; a second determination circuit comparing the output voltage with a second reference value in a second timing after the first timing to determine a comparison result; and an output control circuit causing the output circuit to stop outputting the output voltage to the load according to a determination result of the first determination circuit or a determination result of the second determination circuit. The circuit thereby controls the output circuit based on if the output voltage is the first reference value or not in the first timing, and if it is the second reference value or not in the second timing. This allows preventing false detection or incomplete detection, improving overcurrent detection accuracy.

According to another aspect of the present invention, there is provided an overcurrent protection circuit for protecting an output transistor driving a load from an overcurrent which includes a first voltage detector detecting that an output voltage to the load is a first voltage; a second voltage detector detecting that the output voltage is a second voltage; a first time detector detecting that a first time period has passed since turn-on of the output transistor; a second time detector detecting that a second time period has passed since detection of the first voltage; and a controller turning off the output transistor if the first voltage is not detected before detection that the first time period has passed, and turning off the output transistor if the second voltage is not detected after detection that the second timer period has passed. The circuit thereby controls the output transistor based on if the output voltage is the first voltage or not when the first time period has passed, and if it is the second voltage or not when the second time period has passed. This allows preventing false detection or incomplete detection, improving overcurrent detection accuracy.

According to still another aspect of the present invention, there is provided a semiconductor apparatus which includes an output transistor driving a load; a first voltage detection circuit detecting that an output voltage to the load is a first voltage; a second voltage detection circuit detecting that the output voltage is a second voltage higher than the first voltage; a first timer circuit detecting that a first time period has passed since turn-on of the output transistor; a second timer circuit detecting that a second time period has passed since detection of the first voltage by the first voltage detection circuit; and a control circuit turning off the output transistor if the first voltage detection circuit does not detect the first voltage before the first timer circuit detects that the first time period has passed, and turning off the output transistor if the second voltage detection circuit does not detect the second voltage after the second timer circuit detects that the second timer period has passed. The circuit thereby controls the output transistor based on if the output voltage is the first value or not when the first time period has passed, and if it is the second voltage or not when the second time period has passed. This allows preventing false detection or incomplete detection, improving overcurrent detection accuracy.

According to yet another aspect of the present invention, there is provided a method of controlling a driver circuit driving a load which includes detecting that an output voltage to the load is a first voltage; detecting that the output voltage is a second voltage higher than the first voltage; detecting that a first time period has passed since start of output from the driver circuit; detecting that a second time period has passed since detection of the first voltage; stopping output from the driver circuit if the first voltage is not detected before detection that the first time period has passed; and stopping output from the driver circuit if the second voltage is not detected after detection that the second timer period has passed. The circuit thereby controls the driver circuit based on if the output voltage is the first value or not when the first time period has passed, and if it is the second voltage or not when the second time period has passed. This allows preventing false detection or incomplete detection, improving overcurrent detection accuracy.

The present invention provides an overcurrent protection circuit with high detection accuracy.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

First Embodiment

Figure 1:
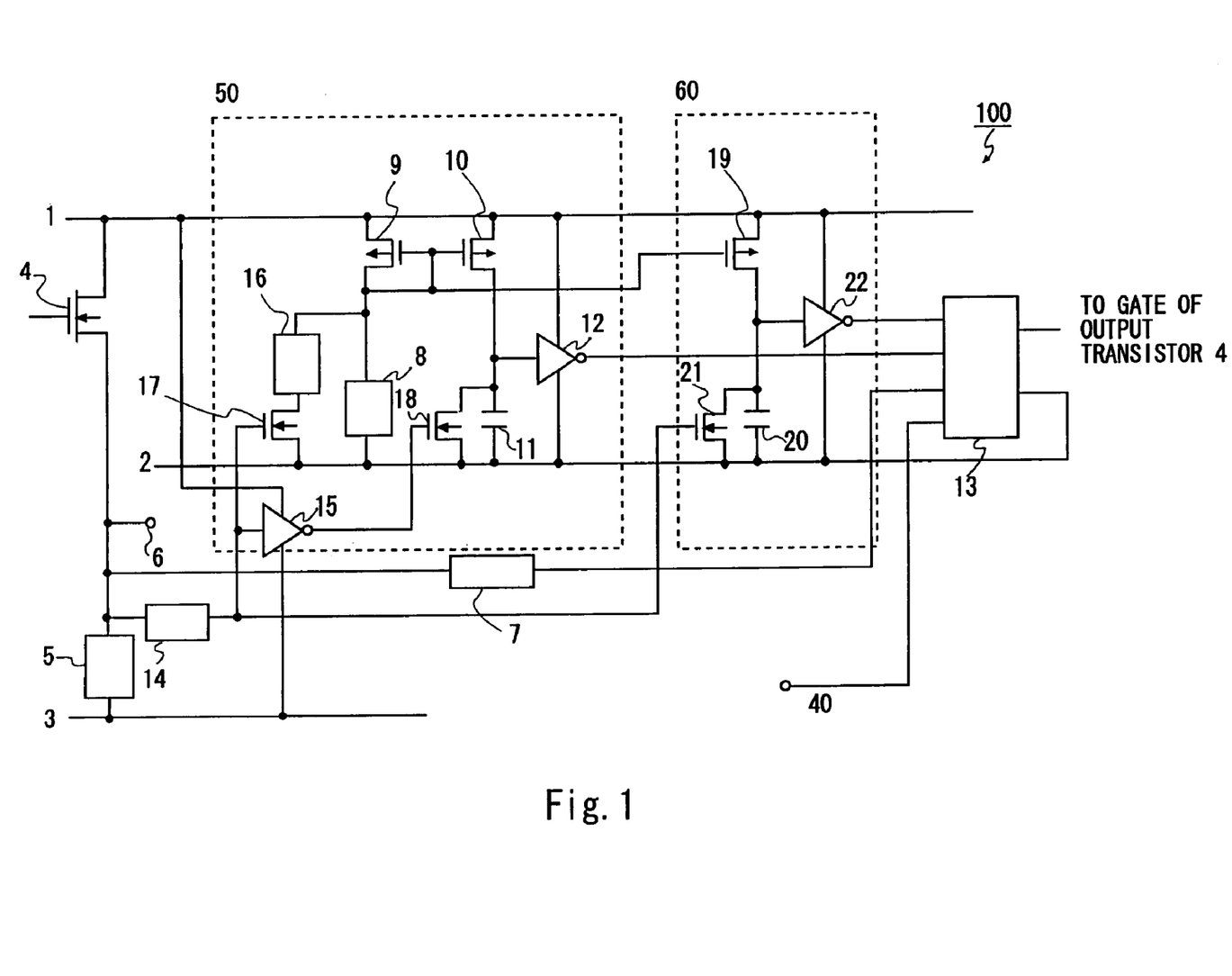
FIG. 1 is a circuit diagram of a power switch of the invention.

Referring first to the circuit diagram of FIG. 1, the configuration of a power switch according to a first embodiment of the invention is explained hereinafter. The power switch 100 is a circuit to control the current and voltage flowing into a load 5, and it is, for example, a semiconductor apparatus in one chip. The power switch 100 is turned on or off in accordance with an input signal 40 output from a microcomputer (not shown) or the like.

The power switch 100 has an output transistor 4, output voltage detection circuits 7 and 14, timer circuits 50 and 60, and a control circuit 13. An overcurrent protection circuit which protects the output transistor 4 from overcurrent is a circuit including the output voltage detection circuits 7 and 14, timer circuits 50 and 60, and control circuit 13 in this case.

The timer circuit 50 is a timer which detects a time t2 (first timing) after the output transistor 4 starts outputting a voltage. The timer circuit 50 detects the time t2 when a first time period has passed since the output transistor 4 starts outputting a voltage. The timer circuit 50 has an inverter 15, a constant current device 16, an Nch enhancement MOS (hereinafter as Nch MOS) 17, a Pch MOS 9, a Pch MOS 10, a capacitor 11, an inverter 12, an Nch MOS 18, and a constant current device 8. The timer circuit 60 is a timer which detects a time t1 (second timing) after the output transistor 4 starts outputting a voltage. The timer circuit 60 detects the time t1 when a second time period has passed since the output voltage detection circuit 14 detects a given voltage. The timer circuit 60 has a Pch MOS 19, a capacitor 20, and an Nch MOS 21, and an inverter 22. The timer circuits 50 and 60 do not necessarily have these configurations, and they may be composed of a constant current source, a delay circuit and so on.

The power switch 100 is supplied with the voltages of a first power supply 1 and a third power supply 3. For example, the voltage of the first power supply 1 is a battery voltage, and the voltage of the third power supply 3 is a ground voltage. Because the output transistor 4 is connected closer to the battery than the load 5 is, the output transistor 4 is a high-side switch.

The output transistor 4 is a switch which controls the output to the load 5, and it is, for example, a MOS. The output transistor 4 may be either an Nch MOS or a Pch MOS. The example below uses an Nch MOS. Use of an Nch MOS forms a source follower in which a source voltage follows a gate voltage.

Generally, there are two different structural types of MOS: a horizontal device in which a current flows parallel to a substrate surface, and a vertical device in which a current flows perpendicular to a substrate surface. The vertical device has a higher current-carrying capacity per unit area than the horizontal device because one of main electrodes is located in the bottom side of the semiconductor device. Thus, the vertical device is mainly used as a high power device. This example uses a vertical MOS for the output transistor 4 and a horizontal MOS for other MOS.

The output transistor 4 has a drain connected to the first power supply 1, a gate connected to the output side of the control circuit 13, and a source connected to one side of the load 5 through an output terminal 6. The other side of the load 5 is connected to a third power supply 3.

The Pch MOS 9, the Pch MOS 10, and the Pch MOS 19 form a current mirror, having sources connected to the first power supply 1, gates connected to each other and further to the drain of the Pch MOS 9. Each Pch MOS thereby obtains a current proportional to the current mirror ratio.

The drain of the Pch MOS 9 is connected to the second power supply 2 through the constant current device 8, and also to the Nch MOS 17 through the constant current device 16 which shortens a timer time. The Nch MOS 17 is a timer speed switch, or a detection period switching part, which switches the timer speed or detection period of the timers 50 and 60 according to the output from the output voltage detection circuit 14. The Nch MOS 17 has a drain connected to the constant current device 16, a source connected to the second power supply 2, and a gate connected to the output side of the output voltage detection circuit 14.

The drain of the Pch MOS 10 is connected to the second power supply 2 through the capacitor 11, to the control circuit 13 through the inverter 12, and to the Nch MOS 18. The Nch MOS 18 is a timer switch, or a detection operation switching part, which switches the operation of the timer 50 according to the output from the output voltage detection circuit 14. The Nch MOS 18 has a drain connected to the drain of the Pch MOS 10, a source connected to the second power supply 2, and a gate connected to the output voltage detection circuit 14 through the inverter 15.

The inverter 15 receives the voltages of the first power supply 1 and the third power supply 3. The inverter 15 has the input side connected to the output side of the output voltage detection circuit 14, and the output side connected to the gate of the Pch MOS 18. The inverter 12 receives the voltages of the first power supply 1 and the second power supply 2. The inverter 12 has the input side connected to the drain of the Pch MOS 10 and the output side connected to the input side of the control circuit 13.

The drain of the Pch MOS 19 is connected to the second power supply 2 through the capacitor 20, to the control circuit 13 through the inverter 22, and to the Nch MOS 21. The Nch MOS 21 is a timer switch, or a detection operation switching part, which switches the operation of the timer 60 according to the output from the output voltage detection circuit 14. The Nch MOS 21 has a drain connected to the drain of the Pch MOS 19, a source connected to the second power supply 2, and a gate connected to the output side of the output voltage detection circuit 14. The inverter 22 receives the voltages of the first power supply 1 and the second power supply 2. The inverter 22 has the input side connected to the drain of the Pch MOS 19 and the output side connected to the input side of the control circuit 13.

The output voltage detection circuit 7 detects the output voltage from the output transistor 4. The output voltage detection circuit 7 is a first determination circuit which determines if the output voltage reaches V2 or a first reference value which is detailed later. It determines if the output voltage reaches V2 at a time t2 or in a first timing, which is also detailed later. The output voltage detection circuit 7 has the input side connected to the output terminal 6 and the output side connected to the input side of the control circuit 13. The output voltage detection circuit 14 also detects the output voltage from the output transistor 4. The output voltage detection circuit 14 is a second determination circuit which determines if the output voltage reaches V1 or a second reference value, which is detailed later. It determines if the output voltage reaches V1 at a time t1 or in a second timing, which is also detailed later. The output voltage detection circuit 14 has the input side connected to the output terminal 6 and the output side connected to the Nch MOS 17, the inverter 15, and the Nch MOS 21 as described above.

The control circuit 13 controls the output of the output transistor 4 in accordance with an input signal 40. The control circuit 13 controls the output of the output transistor 4 in accordance with the output signals from the timer circuits 50 and 60, which are the signals based on the detection result of the output voltage detection circuit 14, and the output signal from the output voltage detection circuit 7. The control circuit 13 receives in the input side the output signals from the inverters 12 and 22, and the output voltage detection circuit 7, and the input signal 40 from a microcomputer or the like. In accordance with these signals, the control circuit 13 outputs from the output side the gate signal of the output transistor 4 and the voltage of the second power supply 2.

Figure 2:
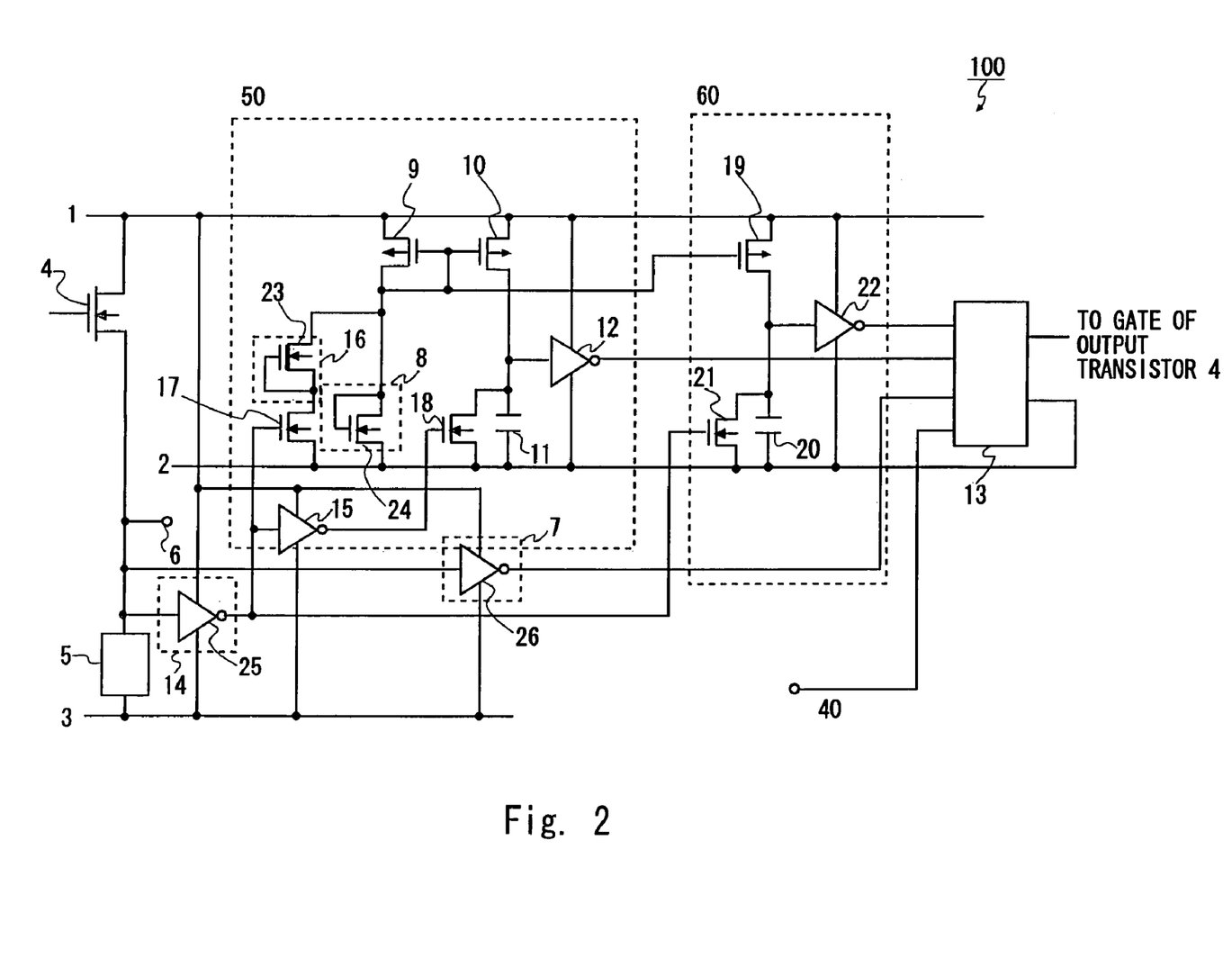
FIG. 2 is a circuit diagram of a power switch of the invention.

Referring next to the circuit diagram of FIG. 2, a specific configuration example of the power switch according to this embodiment is explained. The power switch 100 is the similar circuit to the power switch shown in FIG. 1. The example of FIG. 2 uses an inverter 25 for the output voltage detection circuit 14, an inverter 26 for the output voltage detection circuit 7, an Nch depression MOS 23 with the short-circuited gate and source for the constant current device 16, and an Nch MOS 24 with the short-circuited gate and drain for the constant current device 8. The elements used are not limited to this example, and other voltage detection circuit and constant current circuit may be used.

The inverters 25 and 26 receive the voltages of the first power supply 1 and the third power supply 3. The Nch depression MOS 23 has the drain connected to the drain of the Pch MOS 9 and the source and gate connected to the drain of the Nch MOS 17. The Nch MOS 24 has the drain and gate connected to the drain of the Pch MOS 9, and the soruce connected to the second power supply 2. The other elements are the same as those shown in FIG. 1, and redundant explanation is omitted.

This embodiment places two output voltage detection circuits and two timer circuits, thereby setting two detection reference points for detecting anomaly. For example, the threshold of the inverter 25 as the output voltage detection circuit 14 may be set low or close to the third power supply voltage, the threshold of the inverter 26 as the output voltage detection circuit 7 may be set high or close to the first power supply voltage, the timer value of the timer circuit 50 may be set short, and the timer value of the timer circuit 60 may be set long.

Figure 3A:
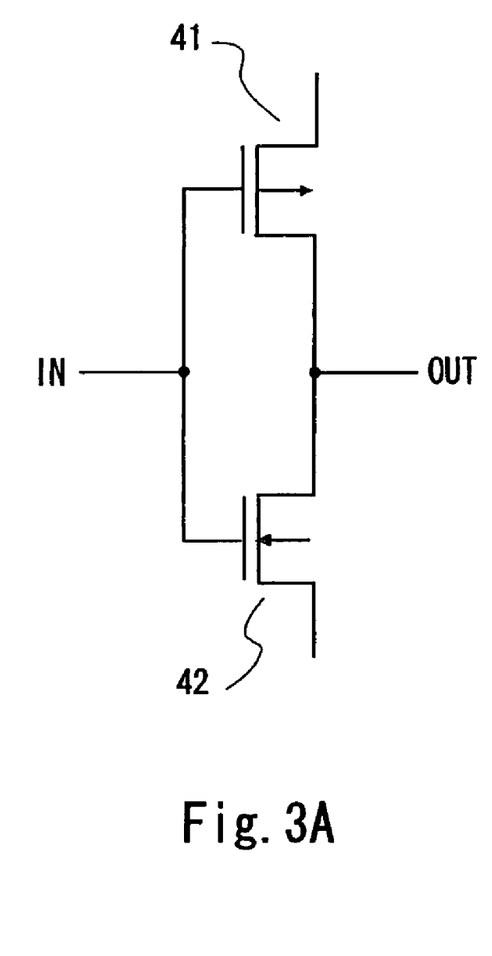
FIG. 3 is a circuit diagram of an inverter used for a power switch of the invention.
Figure 3B:
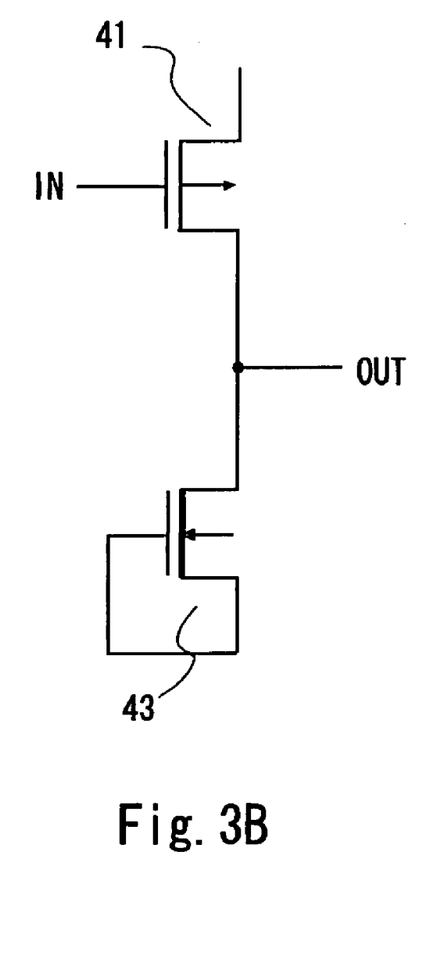
Figure 3C:
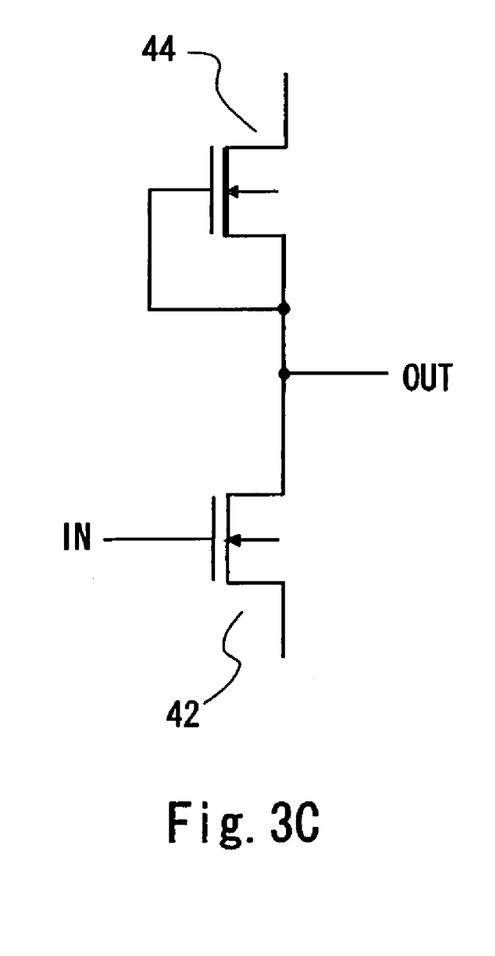

The circuit diagrams of FIGS. 3A, 3B, and 3C show the configuration examples of the inverter used in the power switch of this embodiment. The inverter may be used as the inverters 12, 15, 22, 25, and 26 in FIG. 2.

FIG. 3A is a complementary mental-oxide semiconductor (CMOS) inverter. This inverter has a Pch MOS 41 and an Nch MOS 42. For example, the source of the Pch MOS 41 receives a high-level supply voltage and the source of the Nch MOS 42 receives a low-level supply voltage. The gates of the Pch MOS 41 and the Nch MOS 42 are connected to each other, and the node between the gates serves as an input. Further, the drains of the Pch MOS 41 and the Nch MOS 42 are connected to each other, and the node between the drains serves as an output. If the input is a low level, the Pch MOS 41 is on and the Nch MOS 42 is off, and the output is a high level. If, on the other hand, the input is a high level, the Pch MOS 41 is off and the Nch MOS 42 is on, and the output is a low level.

FIG. 3B is a constant current load inverter where a Pch MOS receives an input. This inverter has the Pch MOS 41 and an Nch depression MOS 43 which serves as a constant current load. For example, the source of the Pch MOS 41 receives a high-level supply voltage, and the gate serves as an input. The source of the Nch depression MOS 43 receives a low-level supply voltage, and the gate and source are short-circuited. The drains of the Pch MOS 41 and the Nch depression MOS 43 are connected to each other, and the node between the drains serves as an output. If the input is a low level, the Pch MOS 41 is on and the output is a high level. If, on the other hand, the input is a high level, the Pch MOS 41 is off and the output is a low level.

FIG. 3C is a constant current load inverter where an Nch MOS receives an input. This inverter has an Nch depression MOS 44 which serves as a constant current load, and the Nch MOS 42. For example, the drain of the Nch depression MOS 44 receives a high-level supply voltage, and the gate and source are short-circuited. The source of the Nch MOS 42 receives a low-level supply voltage, and the gate serves as an input. The source of the Nch depression MOS 44 and the drain of the Nch MOS 42 are connected to each other, and the node between them serves as an output. If the input is a low level, the Nch MOS 42 is off and the output is a high level. If, on the other hand, the input is a high level, the Nch MOS 42 is on and the output is a low level.

The above configurations are examples, and the inverter may have other configurations. For example, the Nch depression MOS 43 and 44 may be replaced by a Pch depression MOS with the short-circuited gate and source, a resistor, and so on.

Figure 4A:
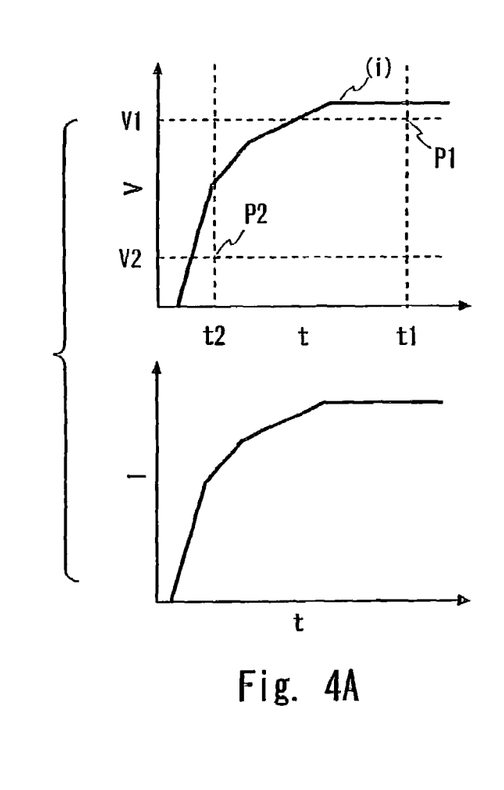
FIGS. 4A, 4B, and 4C are output waveforms of a power switch of the invention.
Figure 4B:
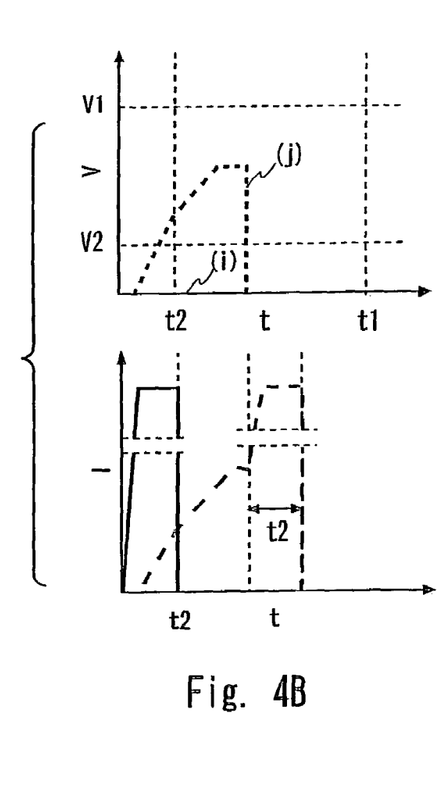
Figure 4C:
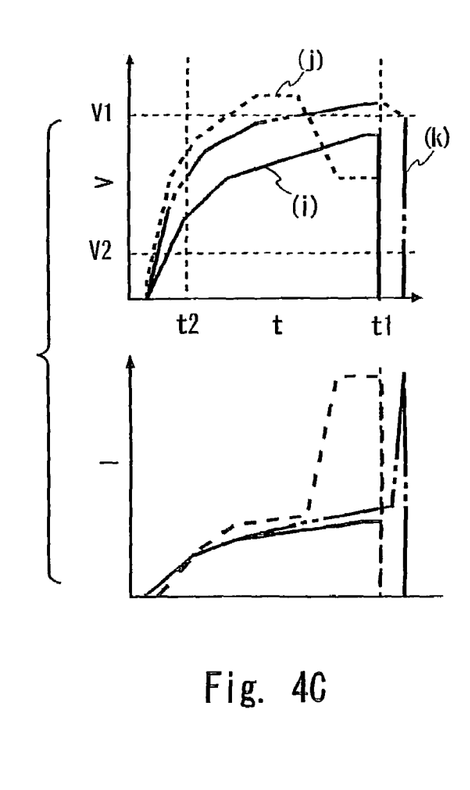

Referring then to FIGS. 4A, 4B, and 4C, the operation of the power switch of this embodiment is explained hereinafter. In the graphs of FIGS. 4A to 4C, the threshold detected by the inverter 26, or the output voltage detection circuit 7, is V1, and the threshold detected by the inverter 25, or the output voltage detection circuit 14, is V2. The time when the output of the inverter 22 is inverted after the input of the input signal 40 is t1, and the time when the output of the inverter 12 is inverted after the input of the input signal 40 is t2. The crossing points of t and V are detection reference points: P1 (t1, V1) and P2 (t2, V2). The operations under three different states are described below.

FIG. 4A is the output waveform in the turn-on period under the normal load state. The output voltage thresholds V1 and V2 and the timer values t1 and t2 at the reference points P1 and P2 are set to such values that anomaly is not wrongly detected in the normal load state. As shown in the solid line (i), in the normal load state, the output voltage is V2 or higher at t2 and V1 or higher at t1. Thus, the normal operation is kept without shutting down the circuit.

FIG. 4B is the output waveform in the turn-on period under the load short-circuit state. As shown in the solid line (i), in the load short-circuit state, the output voltage does not increase with time and fails to reach V2 at t2. Thus, anomaly is detected and the circuit is shut down. If, as shown in the dashed line (j), the circuit is in the normal load state immediately after the input of the input signal 40 but it becomes the load short-circuit state between t2 and t1, the circuit is shut down after t2 when the output voltage falls below V2.

FIG. 4C is the output waveform in the turn-on period under the overcurrent state. If, as shown in the solid line (i), the output voltage reaches V2 at t2 but fails to reach V1 at t1, it is detected as the overcurrent state due to abnormal load and the circuit is shut down. If, as shown in the dashed line (j), the output voltage reaches V1 before t1 but then falls below V1 due to the occurrence of anomaly in the load, it is detected as the overcurrent state and the circuit is shut down at t1. If, as shown in the double dashed line (k), anomaly occurs in the load and the output voltage falls below V1 after t1, the circuit is immediately shut down.

The operation of the power switch 100 is explained hereinafter in more detail. Before the input signal 40 is input to the control circuit 13 from a microcomputer or the like, the voltage of the second power supply 2 is equal to the voltage of the first power supply 1, which is, for example, a high level ("H"). Thus, no current flows into the timer circuits 50 and 60 and the timer function does not operate.

If the input signal 40 is input to the control circuit 13, the control circuit 13 outputs a low level ("L") to the second power supply 2. This creates a voltage difference between the second power supply 2 and the first power supply 1, and a current starts flowing into the timer circuits 50 and 60, activating the timer function.

At the same time, the control circuit 13 outputs a gate signal to turn on the output transistor 4, thereby starting the turn-on of the output transistor 4. The output voltage immediately after the input of the input signal 40 or immediately after the start of the turn-on is close to the voltage of the third power supply 3, which is, for example, a ground voltage, as shown in FIG. 4A. Because the output voltage is lower than V1 and V2, the outputs of the inverters 25 and 26 are not inverted but remain "H".

At this time, the Nch MOS 17 is on, with "H" input to its gate. The Nch MOS 18 is off, with "L" input to its gate. The Nch MOS 21 is on, with "H" input to its gate.

Because the Nch MOS 17 is on, a sum of the currents flowing through the Nch depression MOS 23 and the Nch MOS 24 passes through the current mirror of the Pch MOS 9, the Pch MOS 10, and the Pch MOS 19 and is charged into the capacitor 11 or the capacitor 20. Because the Nch MOS 18 is off, all the drain currents of the Pch MOS 10 is charged to the capacitor 11. Further, because the Nch MOS 21 is on, all the drain currents of the Pch MOS 19 flows into the Nch MOS 21 and not charged to the capacitor 20. Thus, in this state, only the timer circuit 50 operates and the timer circuit 60 does not operate.

In order to reduce the capacitance of the capacitor 11 and the capacitor 20, the current mirror ratio is set to such a transistor size ratio as to significantly reduce the sum of the currents through the Nch depression MOS 23 and the Nch MOS 24.

In the case of normal load state, the output voltage reaches the threshold V2 of the inverter 25 before it reaches the threshold of the inverter 12 or before it reaches t2, as shown in FIG. 4A. If the output voltage reaches the threshold of the inverter 25, the output of the inverter 25 becomes "L" and the output of the inverter 26 becomes "H".

At this time, the Nch MOS 17 is turned off, with "L" input to its gate. The Nch MOS 18 is turned on, with "H" input to its gate. The Nch MOS 21 is turned off, with "L" input to its gate.

Because the Nch MOS 17 is off, the current passing through the current mirror of the Pch MOS 10 and the Pch MOS 19 is the current of the Nch MOS 24 only, which is lower than the above sum of the currents by the amount of the current of the Nch depression MOS 23. Because the current to be charged to the capacitor 11 and the capacitor 20 decreases, the timer speed decreases accordingly. Further, because the Nch MOS 18 is on and the Nch MOS 21 is off, the capacitor to be charged changes from the capacitor 11 to the capacitor 20. Thus, in this state, only the timer circuit 60 operates and the timer circuit 50 does not operate.

Then, if the output voltage increases to reach the threshold V1 of the inverter 26, the output of the inverter 26 is inverted to "L". After that, the capacitor 20 is charged to a given voltage to reach the threshold of the inverter 22 or t1, the output of the inverter 22 is inverted to "L". Because the output of the inverter 26 is "L" when the output of the inverter 22 is "L", the control circuit 13 determines that the turn-on is completed normally and thus does not turn off the output transistor 4.

In the case of the load short-circuit state, as shown in the solid line (i) of FIG. 4B, the capacitor 11 is charged to a given voltage to reach the threshold of the inverter 12 or reach t2 before the output voltage reaches the threshold V2 of the inverter 25 or the threshold V1 of the inverter 26. Upon reaching the threshold of the inverter 12, the output of the inverter 12 is inverted to "L". Because the output of the inverter 26 is "H" when the output of the inverter 12 is "L", the control circuit 13 determines it to be the abnormal state and outputs a gate signal to turn off the output transistor 4 regardless of the input signal 40.

The time to turn off the output transistor 4 is after the time period t2 has passed since the turn-on in the case of the line (i). In the case of the line (j), on the other hand, the time to turn off the output transistor 4 is after the time period t2 has passed since the output voltage falls below V2 because the timer circuit 50 operates again when the output voltage falls below V2. If the output voltage again reaches V2 before the time period t2 has passed since the output voltage falls below V2 in the case of the line (j), the timer circuit 60 starts operating from that point.

The control circuit 13 may further refer to the output of the inverter 25 and determine it as the abnormal state when the output of the inverter 25 is "H" when the output of the inverter 12 is "L".

In the overcurrent state, as shown in the solid line (i) of FIG. 4C, the output voltage reaches the threshold V2 of the inverter 25 before the threshold of the inverter 12 or t2 is reached, but the threshold of the inverter 22 or t1 is reached before the output voltage reaches the threshold V1 of the inverter 26. If the threshold of the inverter 22 is reached, the output of the inverter 22 is inverted to "L". Because the output of the inverter 26 is "H" when the output of the inverter 22 is "L", the control circuit 13 determines it to be the abnormal state and outputs a gate signal to turn off the output transistor 4 regardless of the input signal 40.

Because the timer circuit 60 starts operating when the output voltage reaches V2, the time to turn off the output transistor 4 is after the time period t2 has passed since the output voltage reaches V2. In the case of the line (j) as well, the operation is the same as the case of the line (l) at t1 and turns off the output transistor 4. In the case of the line (k) as well, because the output of inverter 22 is "L" and the output of the inverter 26 is "H" when the output voltage falls below V1 after t1, the output transistor 4 is turned off.

Though the time t1 is the elapsed time since the output voltage reaches V2 in the above example, it is not limited thereto. For example, t1 may be the elapsed time since the turn-on. In this case, it is necessary to activate the timer circuit 60 without turning on the Nch MOS 2.1 in the turn-on operation.

As described in the foregoing, the present embodiment sets two detection reference points, which are the crossing points of the output voltage and the timer value, for detecting anomaly, though conventional circuits have only one detection reference point. Thus, it is possible to shut down the circuit immediately upon occurrence of load short-circuit which gives stress to an output transistor, thereby reducing the stress to the output transistor. More number of detection reference points allows more reliable protection.

Specifically, this embodiment sets two detection reference points of combinations of "a low output voltage detection value in a short timer time" and "a high output voltage detection value in a long timer time". This allows achieving both the immediate shut down when the load short-circuit occurs and the shut down when the overcurrent occurs when the output voltage exceeds a detection value without causing false detection.

The time until the output transistor is turned off after the control circuit detects anomaly may be varied according to the load conditions. The output voltage at a detection reference point can be changed simply by changing the thresholds of the inverters 25 and 26 as the output voltage detection circuits. The timer value can be also changed simply by changing either of the current values of the Nch depression MOS 23 and the Nch MOS 24 as constant current devices, the current mirror ratio of the Pch MOS 9, 10, and 19, and the capacitance of the capacitor 11 and 20.

Second Embodiment

Figure 5:
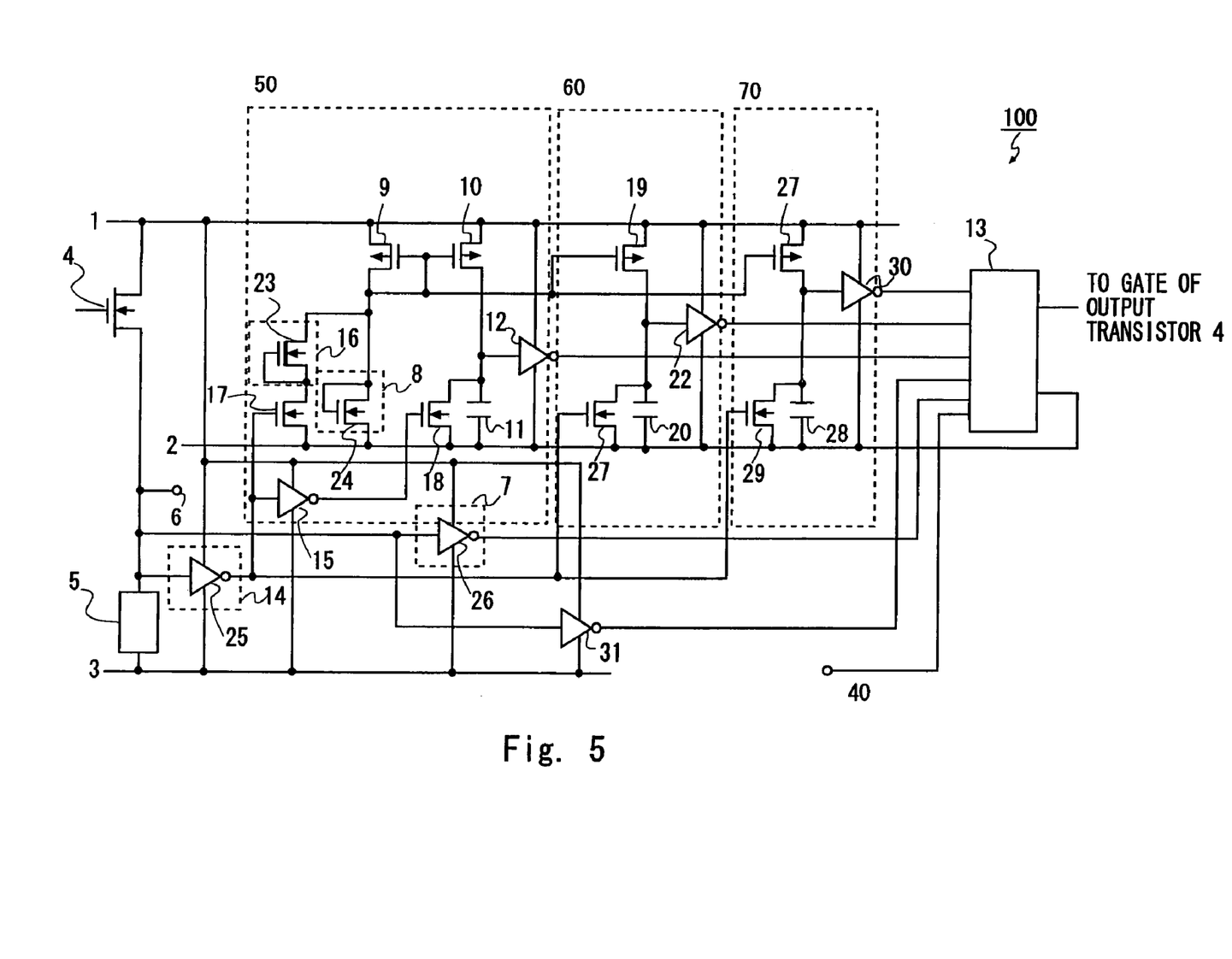
FIG. 5 is a circuit diagram of a power switch of the invention.

Referring now to the circuit diagram of FIG. 5, the configuration of a power switch according to the second embodiment of the invention is explained hereinafter. The power switch 100 further includes a timer circuit 70 and an inverter 31 which serves as an output voltage detection circuit in addition to the elements of the power switch 100 shown in FIGS. 1 and 2. The timer circuit 70 has a Pch MOS 27, a capacitor 28, an Nch MOS 29, and an inverter 30. In FIG. 5, the same reference symbols as in FIGS. 1 and 2 designate the same elements.

The timer circuit 70 has the similar configuration and operation to the timer circuit 60, except for a timer value. The inverter 31 has the similar configuration and operation to the inverter 26, except for a threshold.

This embodiment sets another detection reference point P3 (t3, V3) in addition to P1 and P2 in case that the output of the inverter 30 is inverted or t3 is reached, before the output of the inverter 31 for output voltage detection is inverted or V3 is reached. The threshold V3 of the inverter 31 is set to a given value between V2 and V1 shown in FIGS. 4A to 4C. Accordingly, the time t3 when the inverter 30 is inverted is between t2 and t1 shown in FIGS. 4A to 4C. The operation of the power switch 100 is the same as shown in FIGS. 2 and 4A to 4C.

The detection reference point P3 (t3, V3) is set in such a value that anomaly is not wrongly detected in the normal load state. Setting three detection reference points for detecting abnormal load further reduces the stress to the output transistor upon occurrence of anomaly in the load.

Third Embodiment

Figure 6:
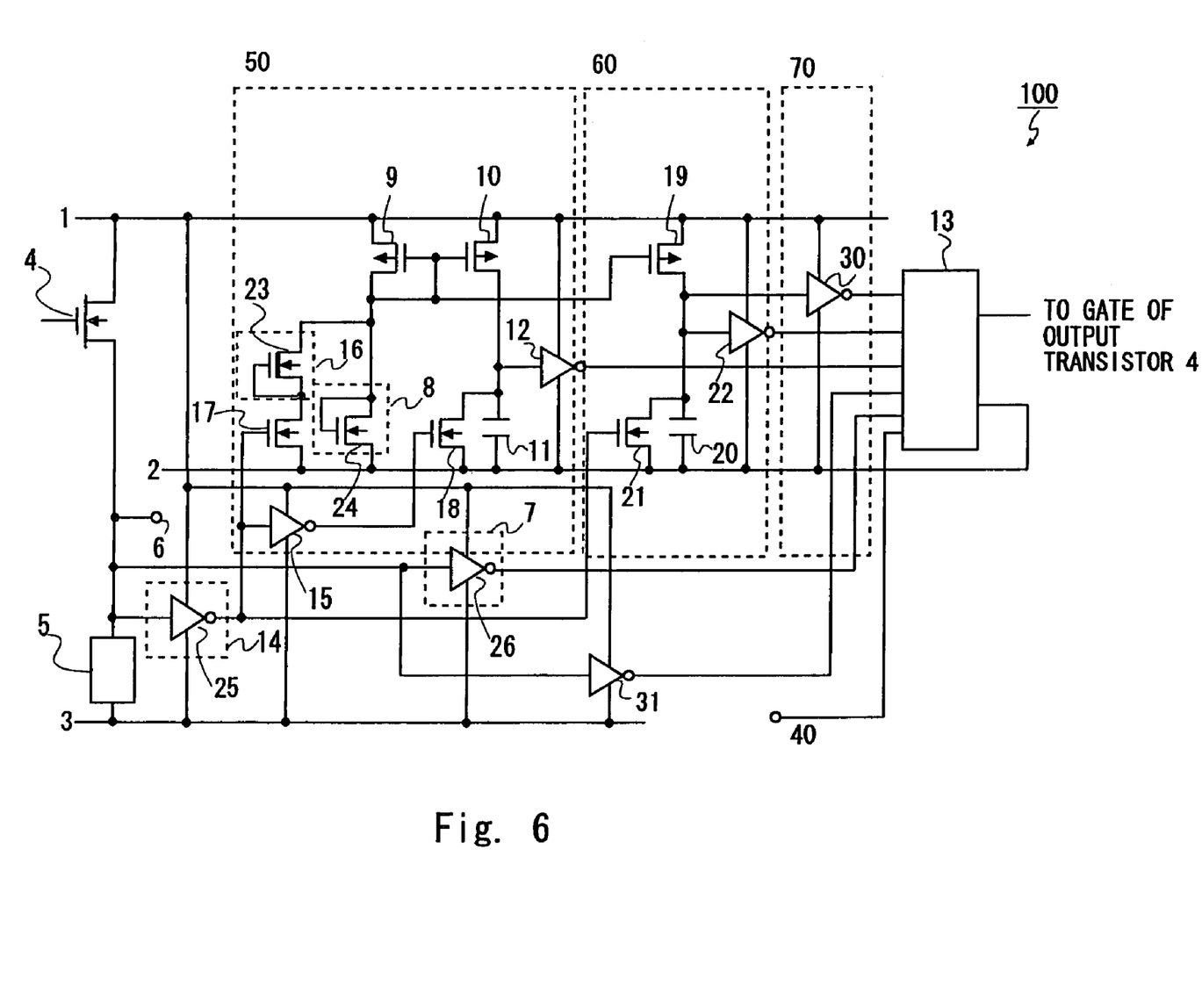
FIG. 6 is a circuit diagram of a power switch of the invention.

Referring now to the circuit diagram of FIG. 6, the configuration of a power switch according to a third embodiment of the invention is explained. The power switch 100 has the same configuration as the power switch 100 of FIG. 5, except that the configuration of the timer circuit 70 is different. The timer circuit 70 of this embodiment eliminates the Pch MOS 27, the Nch MOS 29, and the capacitor 28 of FIG. 5, and it has the inverter 30 only. In FIG. 6, the same reference symbols as in FIG. 5 designate the same elements.

In this embodiment, the input of the inverter 30 is common to the input of the inverter 22. A time difference between t1 and t3 is created by a difference in the threshold of the inverter 22 and the inverter 30. Because the timer value is shorter in t3, the threshold of the inverter 30 is set close to the voltage of the second power supply 2. This allows reducing the number of elements without changing functions.

Other Embodiments

In the above power switch 100, a given circuit may be placed between the output side of the control circuit 13 and the gate of the output transistor 4. For example, a charge pump and a gate resistor may be placed so that the charge pump outputs a boosted voltage in accordance with the output of the control circuit 13 to turn on the output transistor 4. Further, an Nch depression MOS may be used as a gate resistor between the charge pump and the gate of the output transistor 4. Correlating the gate resistance to the current value of the Nch depression MOS 23 as a constant current device allows the circuit design without variation.

Though the above examples use a MOS for the output transistor, it is not limited thereto, and another switching device may be used. For example, Insulated Gate Bipolar Transistor (IGBT) or Gate Turn Off (GTO) thyristor and so on may be used instead.

It is apparent that the present invention is not limited to the above embodiment that may be modified and changed without departing from the scope and spirit of the invention.

What is claimed is:

1. An overcurrent protection circuit for protecting an output transistor driving a load from an overcurrent, comprising:
a first voltage detector detecting that an output voltage to the load is a first voltage;
a second voltage detector detecting that the output voltage is a second voltage;
a first time detector detecting that a first time period has passed since turn-on of the output transistor;
a second time detector detecting that a second time period has passed since detection of the first voltage; and
a controller turning off the output transistor if the first voltage is not detected before detection that the first time period has passed, and turning off the output transistor if the second voltage is not detected after detection that the second timer period has passed.

2. The overcurrent protection circuit of claim 1, wherein the second voltage is higher than the first voltage.

3. The overcurrent protection circuit of claim 1, wherein the second time period is longer than the first time period.

4. The overcurrent protection circuit of claim 1, further comprising a detection operation switch switching operation between the first time detector and the second time detector according to detection of the first voltage by the first voltage detector.

5. The overcurrent protection circuit of claim 1, further comprising a detection period switch switching a detection time period between the first time detector and the second time detector according to detection of the first voltage by the first voltage detector.

6. The overcurrent protection circuit of claim 1, wherein the first voltage detector has a first inverter and the second voltage detector has a second inverter, and
the first voltage is a threshold of the first inverter and the second voltage is a threshold of the second inverter.

7. An overcurrent protection circuit for protecting an output transistor driving a load from an overcurrent, comprising:
a first voltage detector detecting that an output voltage to the load is a first voltage;
a second voltage detector detecting that the output voltage is a second voltage;
a first time detector detecting that a first time period has passed since turn-on of the output transistor;
a second time detector detecting that a second time period has passed since detection of the first voltage; and
a controller turning off the output transistor if the first voltage is not detected before detection that the first time period has passed, and turning off the output transistor if the second voltage is not detected after detection that the second timer period has passed;
wherein:
the first voltage detector has a first inverter and the second voltage detector has a second inverter,
the first voltage is a threshold of the first inverter and the second voltage is a threshold of the second inverter,
the first time detector comprises a first capacitor charged after turn-on of the output transistor, and a third inverter detecting that the first time period has passed based on a voltage of the first capacitor, and
the second time detector comprises a second capacitor charged after detection of the first voltage, and a fourth inverter detecting that the second time period has passed based on a voltage of the second capacitor.

8. The overcurrent protection circuit of claim 7, further comprising:
a first switch starting charging to the first capacitor according to detection of the first voltage by the first voltage detector; and
a second switch starting charging to the second capacitor according to detection of the first voltage by the first voltage detector.

9. The overcurrent protection circuit of claim 7, further comprising a third switch switching a current flowing into the first capacitor and a current flowing into the second capacitor according to detection of the first voltage by the first voltage detector.

10. An overcurrent protection circuit for protecting an output transistor driving a load from an overcurrent, comprising:
a first voltage detector detecting that an output voltage to the load is a first voltage;
a second voltage detector detecting that the output voltage is a second voltage;
a first time detector detecting that a first time period has passed since turn-on of the output transistor;
a second time detector detecting that a second time period has passed since detection of the first voltage; and
a controller turning off the output transistor if the first voltage is not detected before detection that the first time period has passed, and turning off the output transistor if the second voltage is not detected after detection that the second timer period has passed;
wherein:
the first voltage detector has a first inverter and the second voltage detector has a second inverter,
the first voltage is a threshold of the first inverter and the second voltage is a threshold of the second inverter,
the first time detector comprises a first capacitor charged after turn-on of the output transistor, and a third inverter detecting that the first time period has passed based on a voltage of the first capacitor, and
the second time detector comprises a second capacitor charged after detection of the first voltage, and a fourth inverter detecting that the second time period has passed based on a voltage of the second capacitor.

11. The overcurrent protection circuit of claim 10, further comprising:
a first switch starting charging to the first capacitor according to detection of the first voltage by the first voltage detector; and
a second switch starting charging to the second capacitor according to detection of the first voltage by the first voltage detector.

12. The overcurrent protection circuit of claim 10, further comprising a third switch switching a current flowing into the first capacitor and a current flowing into the second capacitor according to detection of the first voltage by the first voltage detector.

13. A semiconductor apparatus comprising
an output transistor driving a load;
a first voltage detection circuit detecting that an output voltage to the load is a first voltage;
a second voltage detection circuit detecting that the output voltage is a second voltage higher than the first voltage;
a first timer circuit detecting that a first time period has passed since turn-on of the output transistor;
a second timer circuit detecting that a second time period has passed since detection of the first voltage by the first voltage detection circuit; and a control circuit turning off the output transistor if the first voltage detection circuit does not detect the first voltage before the first timer circuit detects that the first time period has passed, and turning off the output transistor if the second voltage detection circuit does not detect the second voltage after the second timer circuit detects that the second timer period has passed.

14. A method of controlling a driver circuit driving a load, comprising:

detecting that an output voltage to the load is a first voltage;

detecting that the output voltage is a second voltage higher than the first voltage;

detecting that a first time period has passed since start of output from the driver circuit;

detecting that a second time period has passed since detection of the first voltage;

stopping output from the driver circuit if the first voltage is not detected before detection that the first time period has passed; and     stopping output from the driver circuit if the second voltage is not detected after detection that the second timer period has passed.

15. An overcurrent protection circuit for protecting an output circuit outputting an output voltage to a load from an overcurrent, comprising:

a first comparator constructed to generate a first voltage status output indicative of whether the output voltage is at least as high as a first reference value;

a second comparator constructed to generate a second voltage status output indicative of whether the output voltage is at least as high as a second reference value, the second reference value being greater than the first reference value;

a first timer circuit receiving as an input the first voltage status output, the first timer circuit being constructed and arranged so as to measure a first predetermined time starting from when the output circuit started producing the output voltage and during which the first voltage status output indicates that the output voltage is less than the first reference value, the first timer circuit generating as an output a first indicator signal indicative of whether the output voltage has reached a value at least as high as the first reference value before the first predetermined time;

a second timer circuit receiving as an input the first voltage status output, the second timer circuit being constructed and arranged so as to measure a second predetermined time starting from when the output voltage has reached a value at least as high as the first reference value, the second timer circuit generating as an output a second indicator signal indicative of whether the second predetermined time has passed; and     an output control circuit receiving as inputs the second voltage status output, the first indicator signal, and the second indicator signal;

wherein the output control circuit is constructed and arranged so as to stop the output circuit from generating the output voltage if the output voltage is not at least as high as the first reference value by the first predetermined time, the output control circuit being further constructed and arranged so as to stop the output circuit from generating the output voltage if the output voltage is not at least as high as the second reference value by the second predetermined time.

16. The overcurrent protection circuit of claim 15, wherein the first timer circuit comprises a first capacitor that begins charging when the output circuit starts producing the output voltage, the charging of the first capacitor being stopped when the first comparator indicates that the output voltage is at least as high as the first reference value.

17. The overcurrent protection circuit of claim 16, wherein the second timer circuit comprises a second capacitor that begins charging when the first comparator indicates that the output voltage is at least as high as the first reference value.

18. The overcurrent protection circuit of claim 17, wherein the first timer circuit comprises a first inverter that drives the first indicator signal, an input of the first inverter being controlled by a voltage to which the first capacitor has been charged.

19. The overcurrent protection circuit of claim 18, wherein the second timer circuit comprises a second inverter that drives the second indicator signal, an input of the second inverter being controlled by a voltage to which the second capacitor has been charged.

20. The overcurrent protection circuit of claim 19, wherein the second capacitor is charged at a lower rate than is the first capacitor.

* * * * *